(12) United States Patent
Howder et al.

(10) Patent No.: US 10,930,658 B2
(45) Date of Patent: Feb. 23, 2021

(54) MEMORY ARRAYS AND METHODS USED IN FORMING A MEMORY ARRAY

(71) Applicant: Micron Technology, Inc., Boise, ID (US)

(72) Inventors: Collin Howder, Meridian, ID (US); Chet E. Carter, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/449,912

(22) Filed: Jun. 24, 2019

(65) Prior Publication Data

US 2020/0402988 A1     Dec. 24, 2020

(51) Int. Cl.
*H01L 27/11556* (2017.01)
*H01L 27/11582* (2017.01)
*H01L 27/11519* (2017.01)
*H01L 27/11565* (2017.01)
*H01L 21/311* (2006.01)
*H01L 21/3213* (2006.01)

(52) U.S. Cl.
CPC .. *H01L 27/11556* (2013.01); *H01L 27/11519* (2013.01); *H01L 27/11565* (2013.01); *H01L 27/11582* (2013.01); *H01L 21/31111* (2013.01); *H01L 21/31116* (2013.01); *H01L 21/32134* (2013.01); *H01L 21/32135* (2013.01)

(58) Field of Classification Search
CPC combination set(s) only.
See application file for complete search history.

(56) References Cited

U.S. PATENT DOCUMENTS 10,236,301 B1   3/2019  Howder et al.
10,388,665 B1   8/2019  Xie et al.
(Continued)

OTHER PUBLICATIONS

U.S. Appl. No. 15/992,959, filed May 30, 2018, by Xie et al.
(Continued)

*Primary Examiner* — Telly D Green
(74) *Attorney, Agent, or Firm* — Wells St. John P.S.

(57) ABSTRACT

A method used in forming a memory array comprises forming a substrate comprising a conductor tier comprising upper conductor material, lower metal material, and intervening metal material vertically between the upper conductor material and the lower metal material. The intervening metal material, the upper conductor material, and the lower metal material are of different compositions relative one another. The intervening metal material has a reduction potential that is less than 0.7V away from the reduction potential of the upper conductor material. A stack comprising vertically-alternating insulative tiers and conductive tiers is formed above the conductor tier. Channel material is formed through the insulative tiers and the conductive tiers. Horizontally-elongated trenches are formed through the stack to the conductor tier. Elevationally-extending strings of memory cells are formed in the stack. Individual of the memory cells comprise the channel material, a gate region that is part of a conductive line in individual of the conductive tiers, and a memory structure laterally between the gate region and the channel material in the individual conductive tiers. Other methods and structure independent of method are disclosed.

28 Claims, 11 Drawing Sheets

(56) References Cited

U.S. PATENT DOCUMENTS

| | | |
|---|---|---|
| 2011/0151633 A1 | 6/2011 | Park et al. |
| 2014/0014889 A1 | 1/2014 | Shim et al. |
| 2015/0318301 A1 | 11/2015 | Lee et al. |
| 2016/0268302 A1 | 9/2016 | Lee et al. |
| 2017/0207226 A1 | 7/2017 | Lee |
| 2017/0278859 A1 | 9/2017 | Sharangpani et al. |
| 2019/0311756 A1* | 10/2019 | Sharma .................. G11C 11/22 |
| 2020/0235112 A1* | 7/2020 | Howder ............ H01L 27/11556 |

OTHER PUBLICATIONS

Okinaka et al., "Electroless Plating of Platinum Group Metals", Chapter 16 of Electroless plating: fundamentals and applications, Eds. Mallory et al., 1990, United Kingdom, pp. 421-440.
U.S. Appl. No. 16/702,255, filed Dec. 3, 2019, by Howder et al.
U.S. Appl. No. 16/787,914, filed Feb. 11, 2020, by Howder et al.
U.S. Appl. No. 16/251,241, filed Jan. 18, 2019, by Howder et al.
U.S. Appl. No. 16/445,065, filed Jun. 18, 2019, by Hopkins et al.

\* cited by examiner

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Materials of this other circuitry may undesirably be etched when etching material there-above. For example, such other circuitry may comprise a silicide that is under conductively-doped polysilicon. A vertical stack above the conductively-doped polysilicon may be patterned by etching trenches through the stack and conductively-doped polysilicon to the silicide. This may lead to undesired lateral etching of the polysilicon upon exposure of the silicide due to galvanic reaction/corrosion. Such may lead to failed circuitry.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-19 which may be considered as a "gate-last" or "replacement-gate" process.

Figure 1:
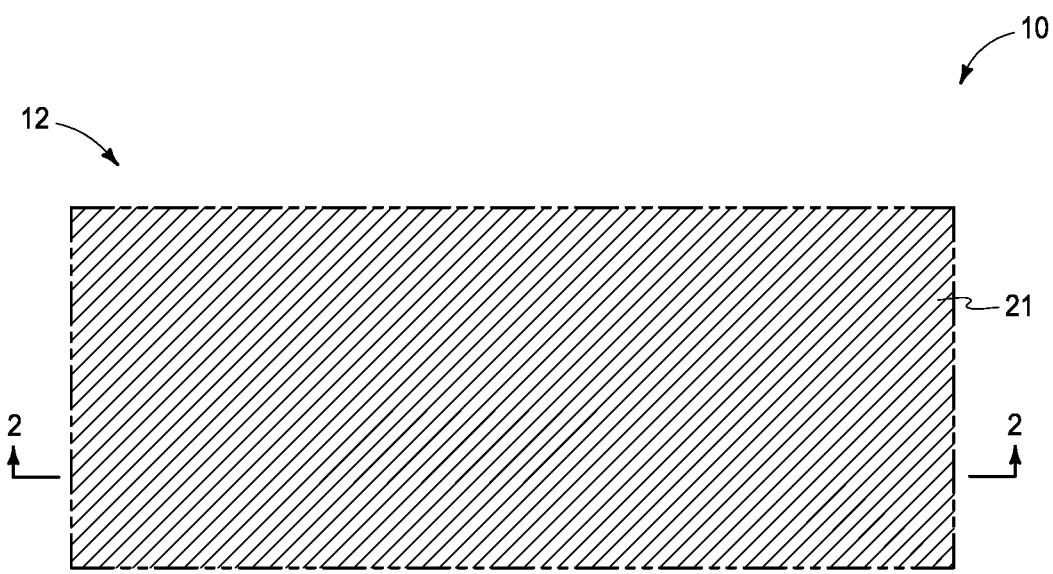
FIG. 1 is a diagrammatic cross-sectional view of a portion of a substrate in process in accordance with an embodiment of the invention and is taken through line 1-1 in FIG. 2.
Figure 2:
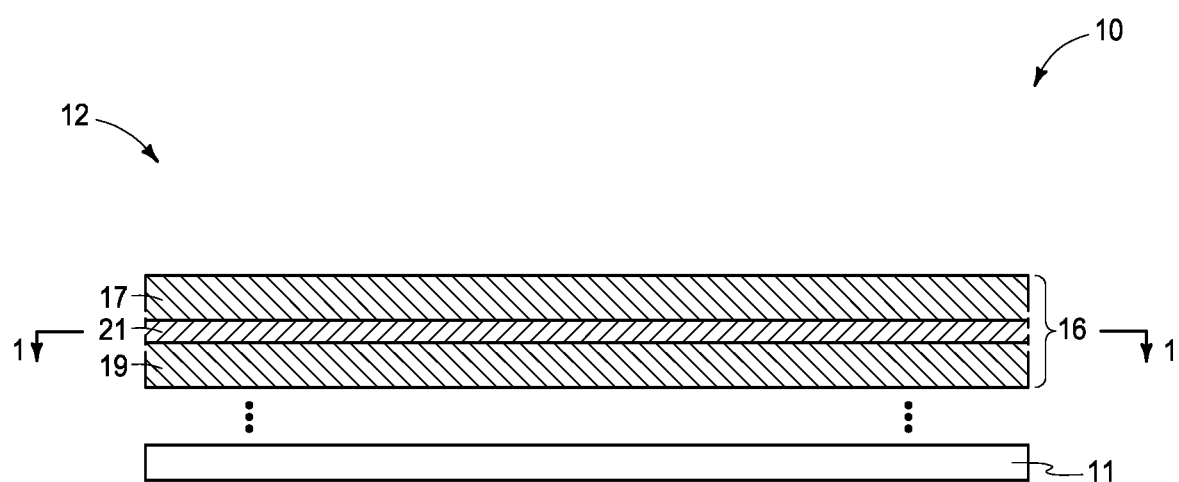
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Example construction 10 comprises a conductor tier 16 that has been formed above substrate 11. Conductor tier 16 may comprise part of control circuitry (e.g., peripheral-under-array circuitry and/or a common source line or plate) used to control read and write access to the transistors and/or memory cells that will be formed within array 12. Example conductor tier 16 comprises upper conductor material 17 (e.g., conductively-doped semiconductive material such as conductively-doped polysilicon), lower metal material 19, and intervening metal material 21 vertically between upper conductor material 17 and lower metal material 19. Example thickness ranges for each of materials 17, 21, and 19 are 500 to 5,000 Angstroms, 100 to 1,000 Angstroms, and 500 to 5,000 Angstroms, respectively.

In one embodiment, intervening metal material 21, upper conductor material 17, and lower metal material 19 are of different compositions relative one another, with intervening metal material 21 having a reduction potential that is less than 0.7V away from (i.e., plus or minus) the reduction potential of upper conductor material 17. In one embodiment, intervening metal material has a reduction potential that is less than 0.5V away, in one such embodiment less than 0.3V away, and in one such embodiment less than 0.1V away, from the reduction potential of upper conductor material 17. In one embodiment, intervening metal material 21 has a higher reduction potential than that of upper conductor material 17. In one embodiment, lower metal material 19 comprises at least one of, in one embodiment at least two of, TiN, WN, Co, Mo, $CoSi_x$, $MoSi_x$, Ta, and Ru. In one embodiment, intervening metal material 21 comprises at least one of, in one embodiment at least two of, TiN, $TiSi_x$, $TiSi_xN_y$, $WSi_xN_y$, WN, WB, $WB_xN_y$, Ta, TaN, $TaSi_x$, $CoSi_x$, CoN, MoN, $MoSi_x$, and AlN. In a prior art construction, conductor tier 16 consists of upper conductor material 17 and a lower metal material 19 (devoid of any intervening material 21), with the upper conductor material consisting of or consisting essentially of conductively-doped polysilicon (reduction potential of −1.0V to −1.2V) and the lower metal material consisting of or consisting essentially of $WSi_x$ (reduction potential of −0.2V to −0.3V). Such difference in reduction potentials of conductively-doped polysilicon and $WSi_x$ of from 0.7 to 1.0 leads to undesired lateral etching of the polysilicon upon exposure of the silicide due to galvanic reaction/corrosion. Using an intervening metal material 21 between an upper conductor material 17 and a lower metal material 19, with the intervening material having a reduction potential that is less than 0.7V away from (i.e., plus or minus) the reduction potential of upper conductor material 17 may reduce or eliminate such galvanic reaction/corrosion.

In one embodiment, upper conductor material 17 comprises conductively-doped polysilicon, lower metal material 19 comprises $WSi_x$, and intervening metal material 21 comprises at least one of TiN and WN. In one such embodiment, the intervening metal material comprises TiN, in one such embodiment comprises WN, and in one such embodiment comprises both of TiN and WN.

Figure 3:
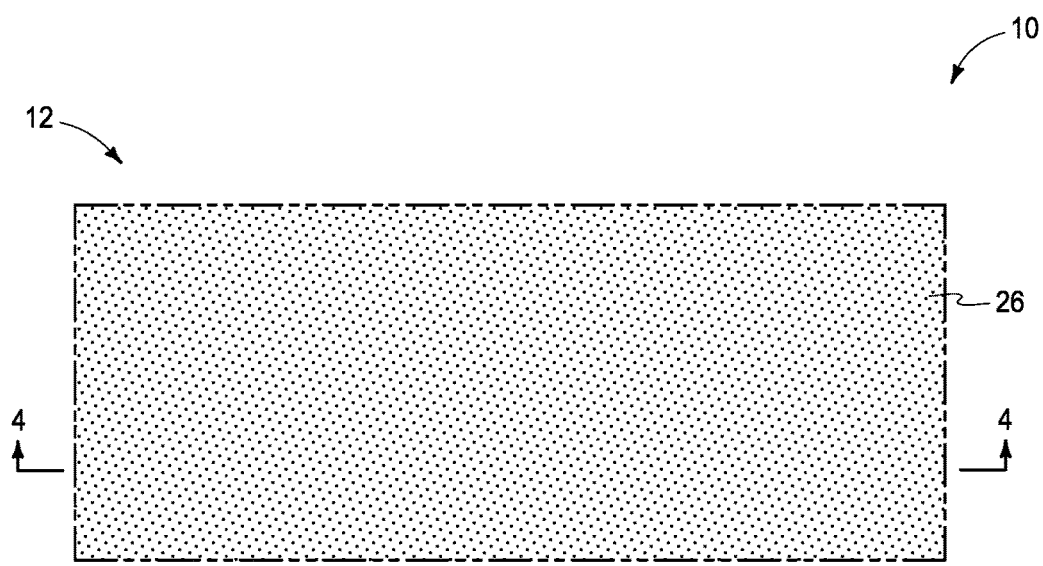
FIGS. 3-19 are diagrammatic sequential sectional and/or enlarged views of the construction of FIGS. 1 and 2 in process in accordance with some embodiments of the invention.
Figure 4:
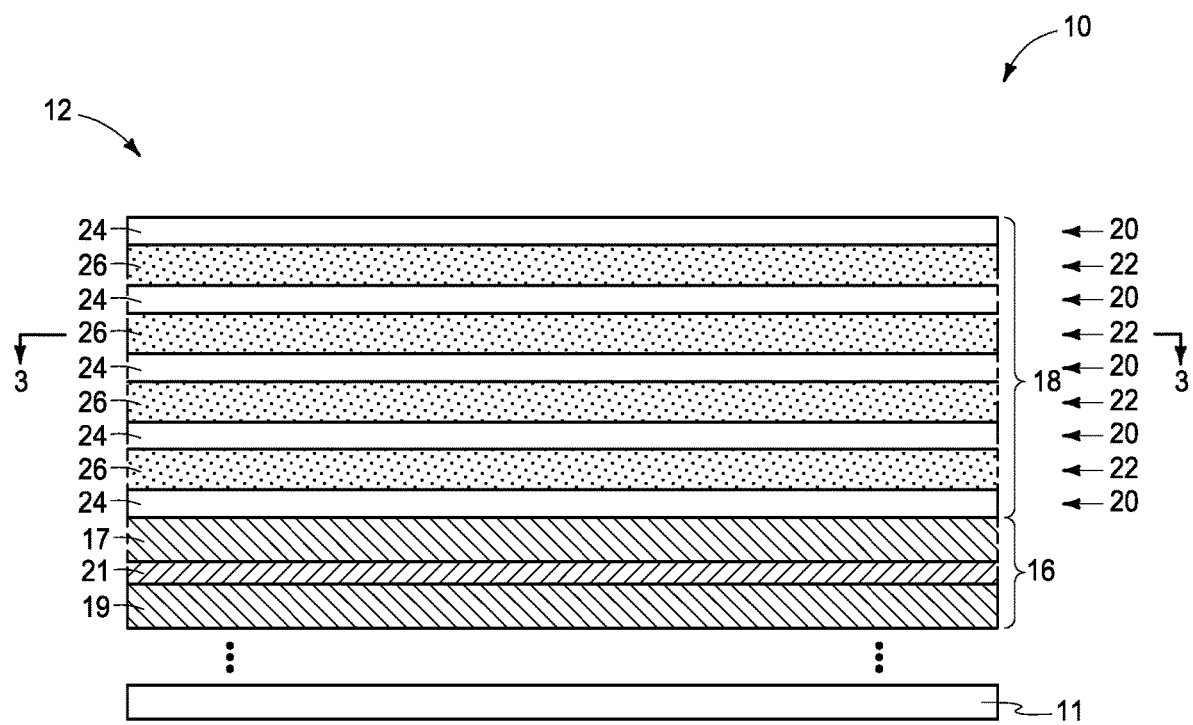

Referring to FIGS. 3 and 4, a stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. Regardless, conductive tiers 22 may not comprise conductive material and insulative tiers 20 may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Figure 5:
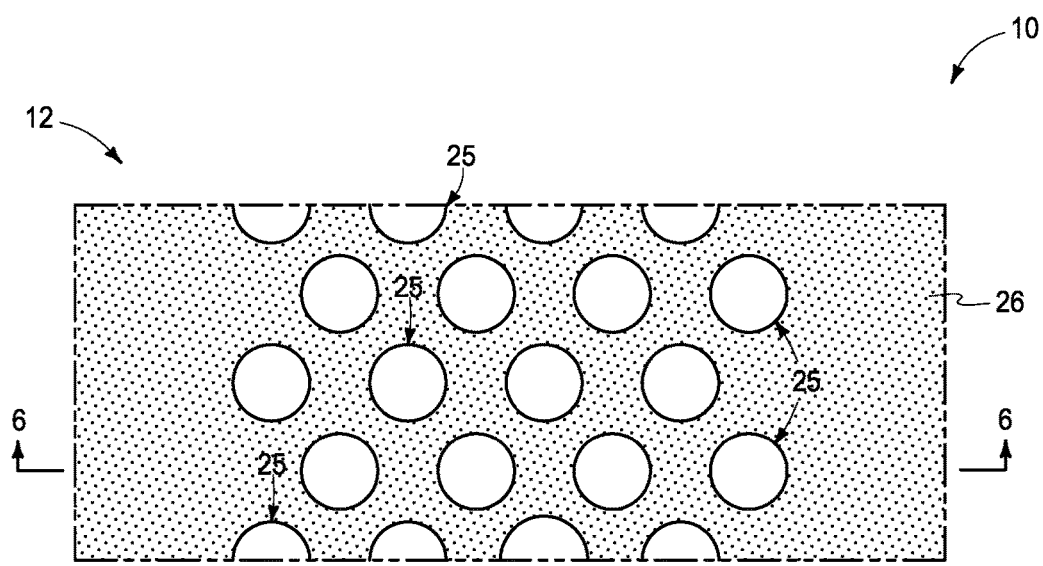
Figure 6:
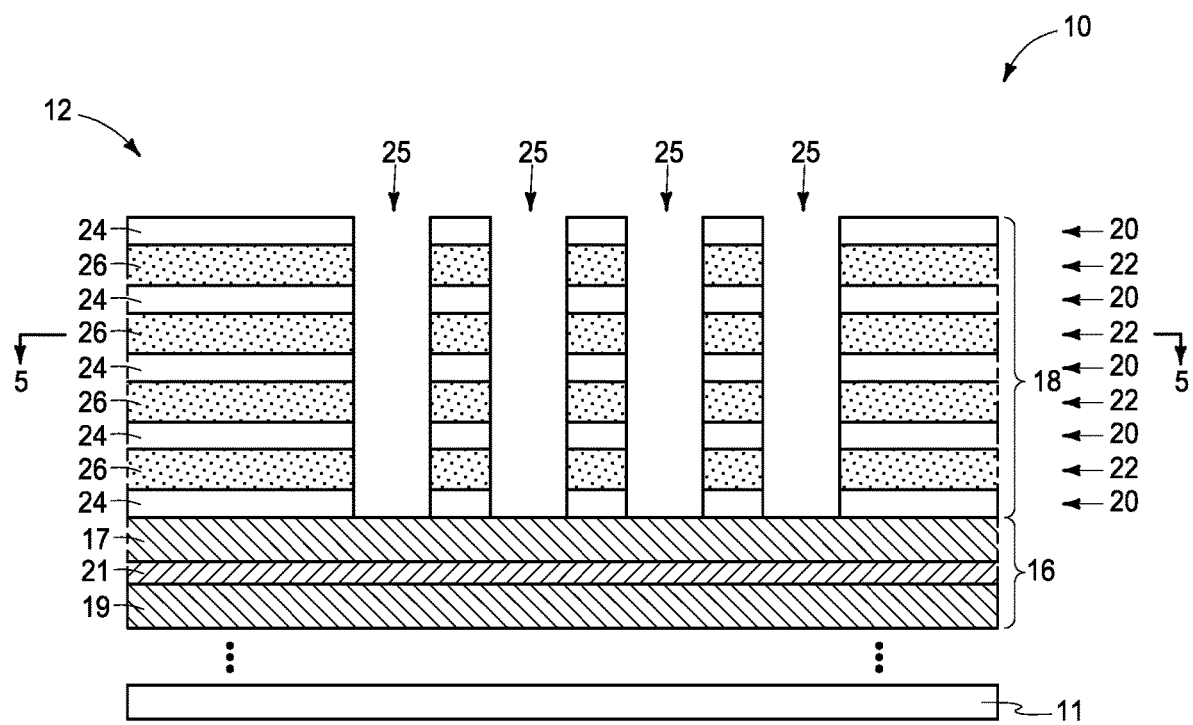

Referring to FIGS. 5 and 6, and in one embodiment, channel openings 25 have been etched through insulative tiers 20 and conductive tiers 22 to upper conductor material 17 of conductor tier 16. Channel openings 25 may go partially into material 17 (not shown), may stop there-atop (as shown), or go completely there-through (not shown) either stopping on intervening metal material 21 or going at least partially there-into. Alternately, as an example, channel openings 25 may stop atop or within lowest insulative tier 20. A reason for extending channel openings 25 at least to material 17 is to assure direct electrical coupling of subsequently-formed channel material (not yet shown) to conductor tier 16 without using alternative processing and structure to do so when such a connection is desired. Etch-stop material (not shown) may be within upper conductor material 17 to facilitate stopping of the etching of channel openings 25 to be atop conductor tier 16 when such is desired. Such etch-stop material may be sacrificial or non-sacrificial. By way example and for brevity only, channel openings 25 are shown as being arranged in groups or columns of staggered rows of four openings 25 per row. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Figure 7:
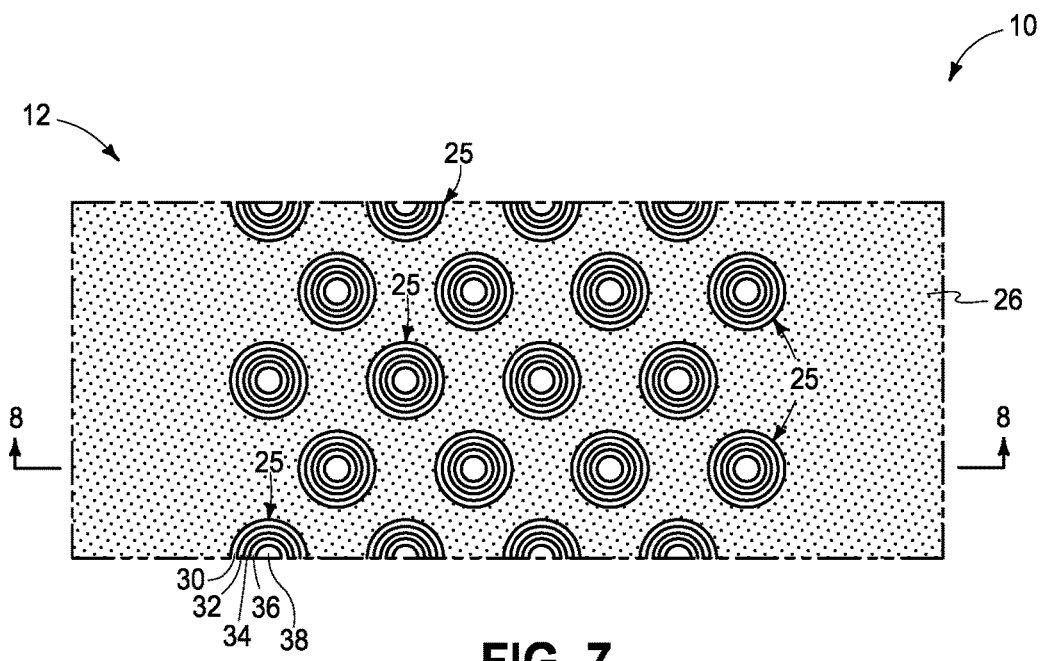
Figure 8:
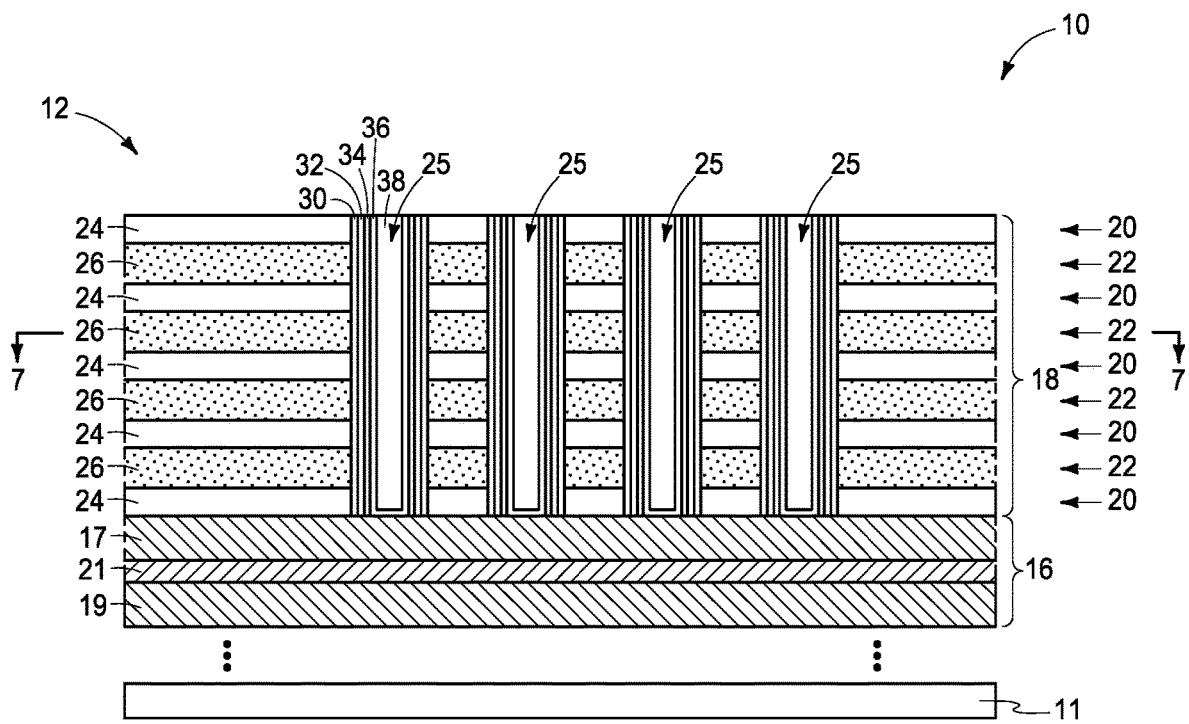

FIGS. 7 and 8 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to an uppermost surface of stack 18. Channel material 36 has been formed in channel openings 25 elevationally along insulative tiers 20 and conductive tiers 22. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against upper conductor material 17 of conductor tier 16. Alternately, and by way of example only, no punch etching may be conducted and channel material 36 may be directly electrically coupled to material 17/21/19 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 9:
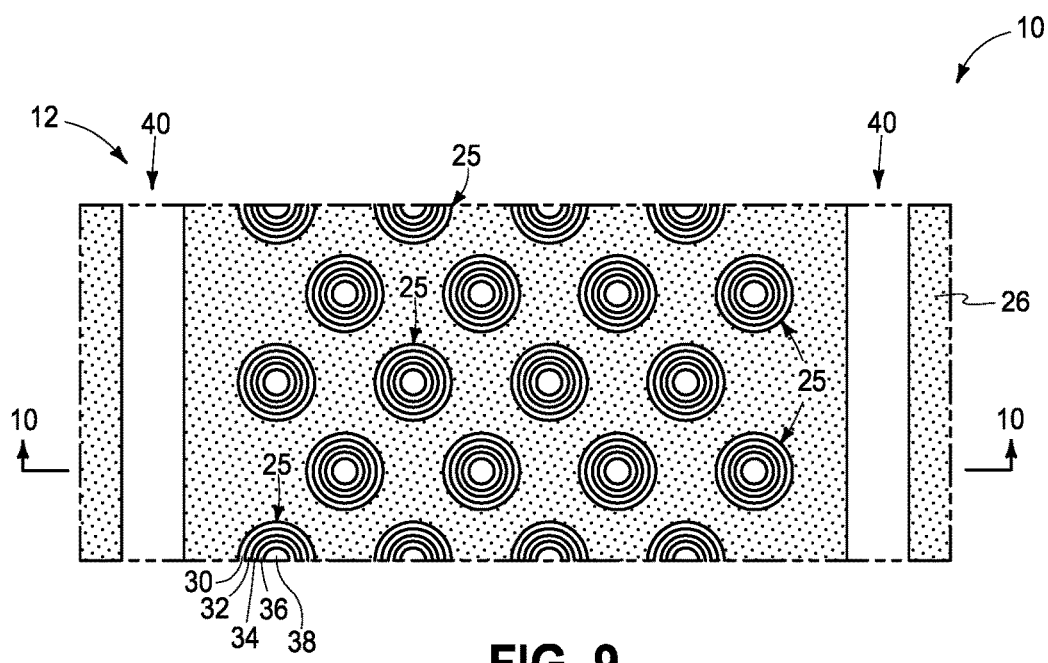
Figure 10:
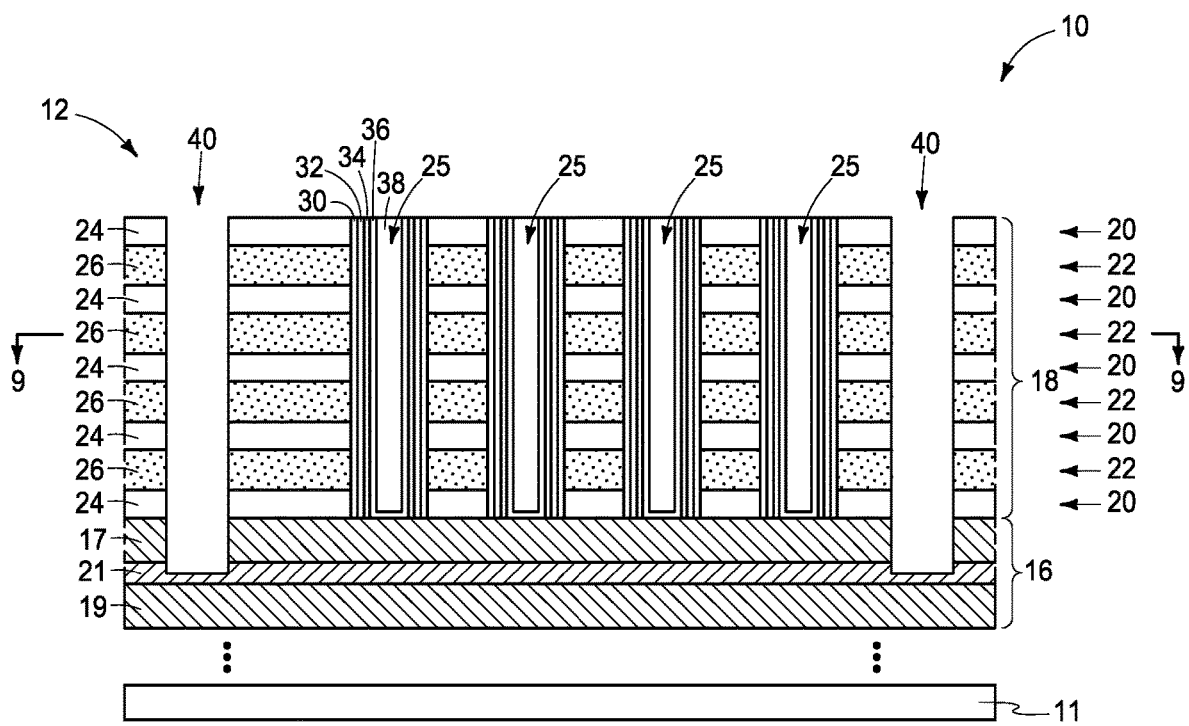
Figure 11:
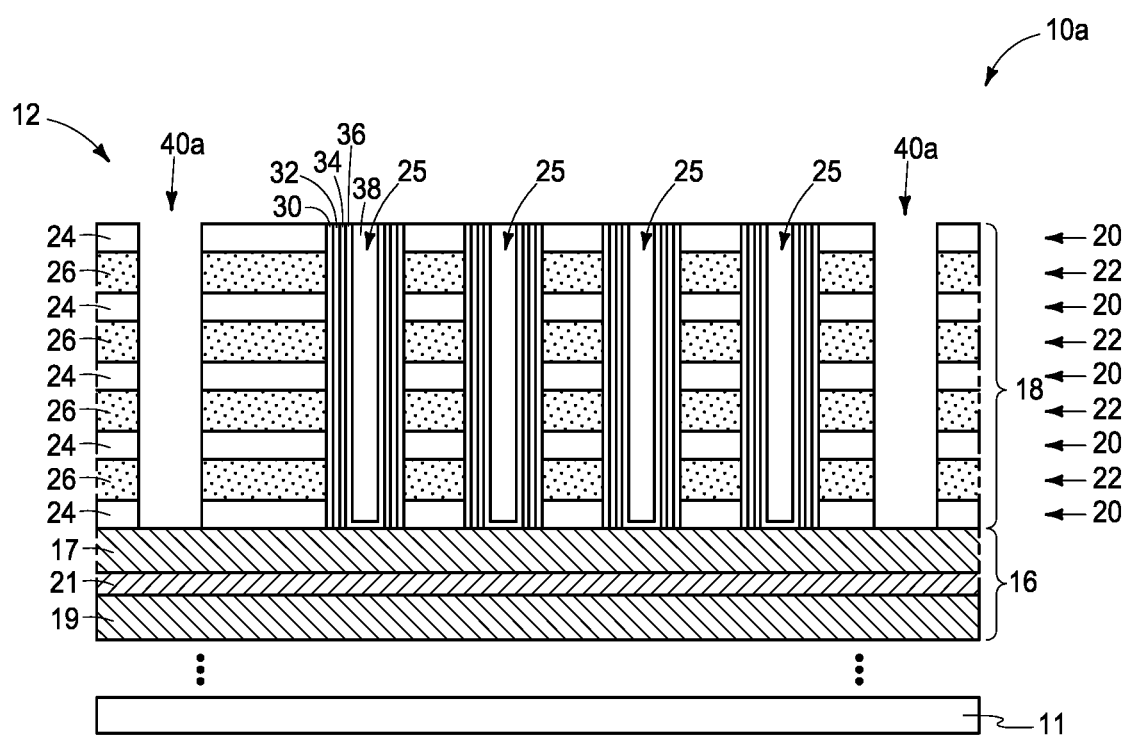

Referring to FIGS. 9 and 10, horizontally-elongated trenches 40 have been formed (e.g., by anisotropic etching) through stack 18 to conductor tier 16. In one embodiment and as shown, horizontally-elongated trenches 40 have been etched to stop on intervening metal material 21 (i.e., atop or within). An alternate embodiment construction 10a is shown in FIG. 11 where horizontally-elongated trenches 40a have been etched to stop on upper conductor material 17 (i.e., atop or within). Like numerals from the above-described embodiments have been used where appropriate with some construction differences being indicated with the suffix "a". Any other attribute(s) or aspect(s) as shown and/or described herein with respect to other embodiments may be used. Regardless, ideally horizontally-elongated trenches 40/40a do not extend to lower metal material 19 to prevent galvanic reaction/corrosion of upper conductor material 17 relative to lower metal material 19. With intervening metal material 21 having a lower reduction potential than that of upper conductor material 17, lateral galvanic reaction/corrosion of upper conductor material 17 may be lessened in comparison to etching using structure that does not have intervening metal material 19.

Figure 12:
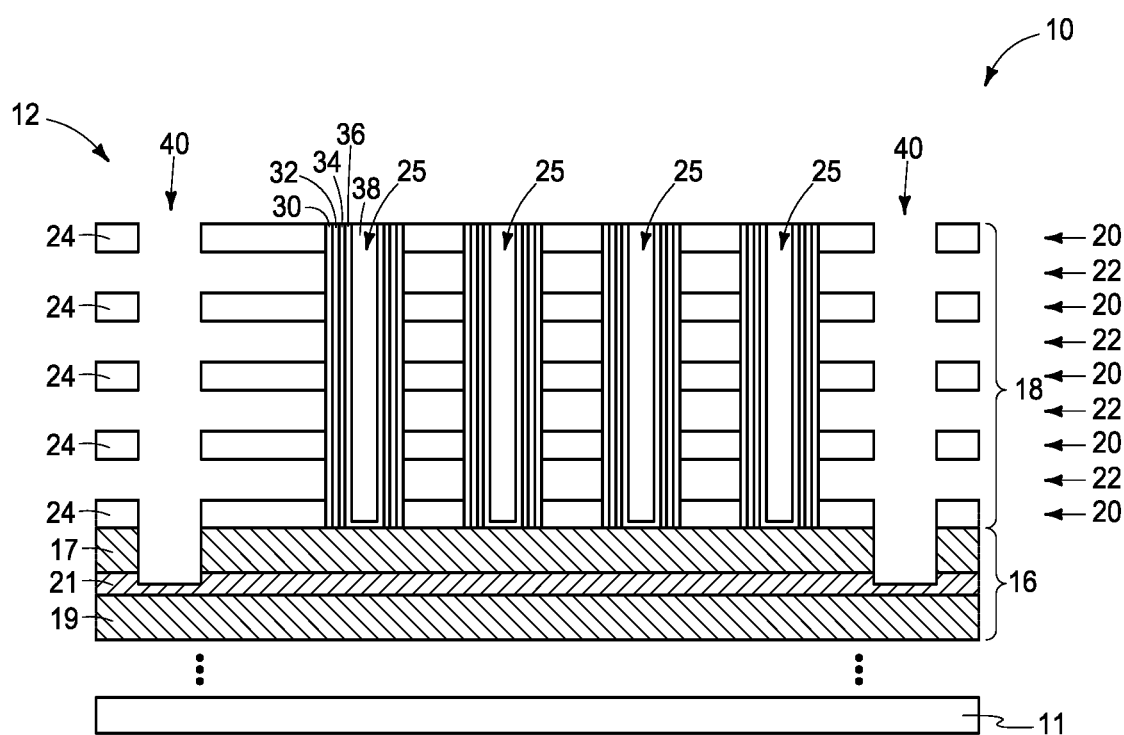

Referring to FIG. 12, material 26 (not shown) of conductive tiers 22 has been etched selectively relative to materials 24, 17, 21, 30, 32, 34, 36, and 38 (e.g., using liquid or vapor $H_3PO_4$ as a primary etchant where material 26 is silicon nitride, material 24 is silicon dioxide, and material 17 is polysilicon).

Figure 13:
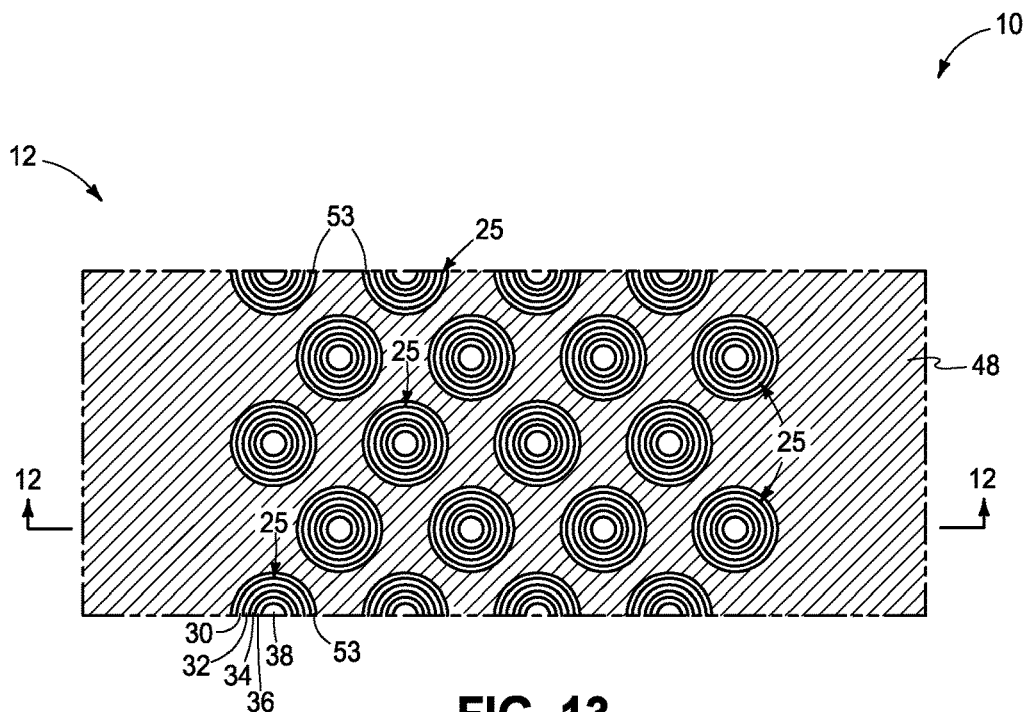
Figure 14:
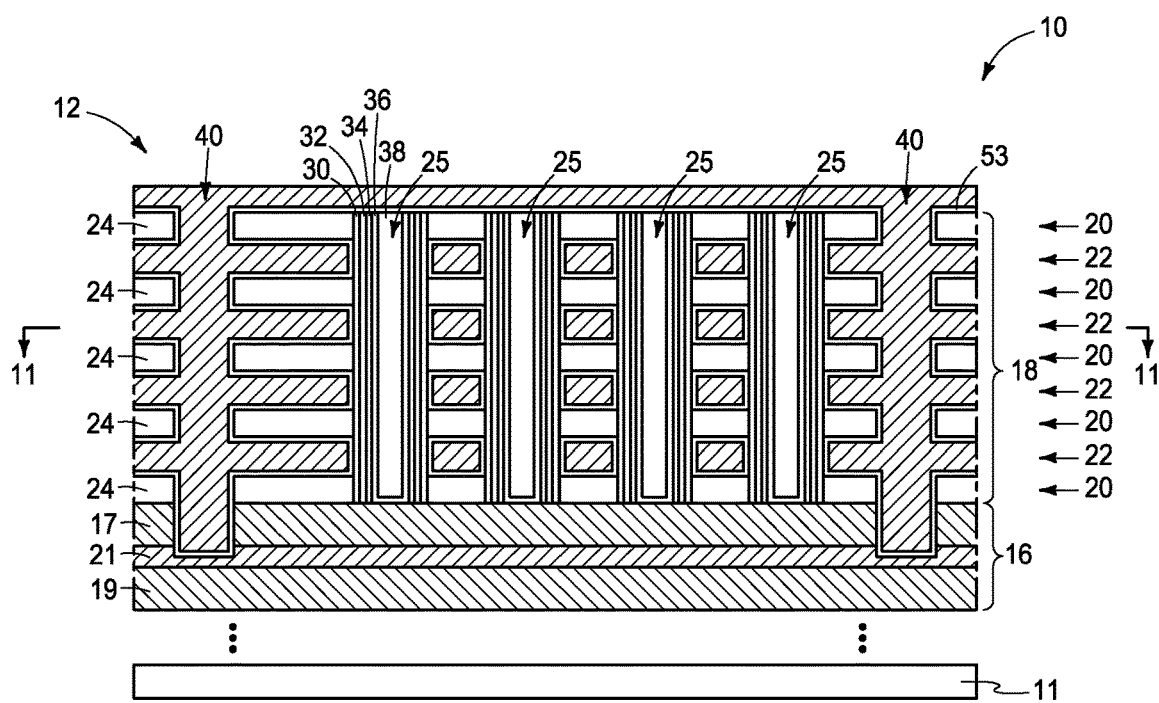

Conducting material is ultimately formed into conductive tiers 22 and into the one or more select gate tiers and which will comprise conducting material of the individual conductive lines and select gates to be formed. Such thereby in the example embodiment replaces the second material in the conductive tiers with the conducting material. Referring to FIGS. 13 and 14, such show an example embodiment wherein an insulating material 53 (e.g., at least one of $Al_2O_3$ and $HfO_x$) has been formed into conductive tiers 22 through trenches 40 followed by forming conducting material 48 into conductive tiers 22 through trenches 40. Any suitable conducting material 48 may be used, for example one or both of metal material (e.g., elemental tungsten) and/or conductively-doped semiconductive material. In but one example embodiment, conducting material 48 comprises a first-deposited conformal titanium nitride liner (not shown) followed by deposition of another composition metal material (e.g., elemental tungsten).

Figure 15:
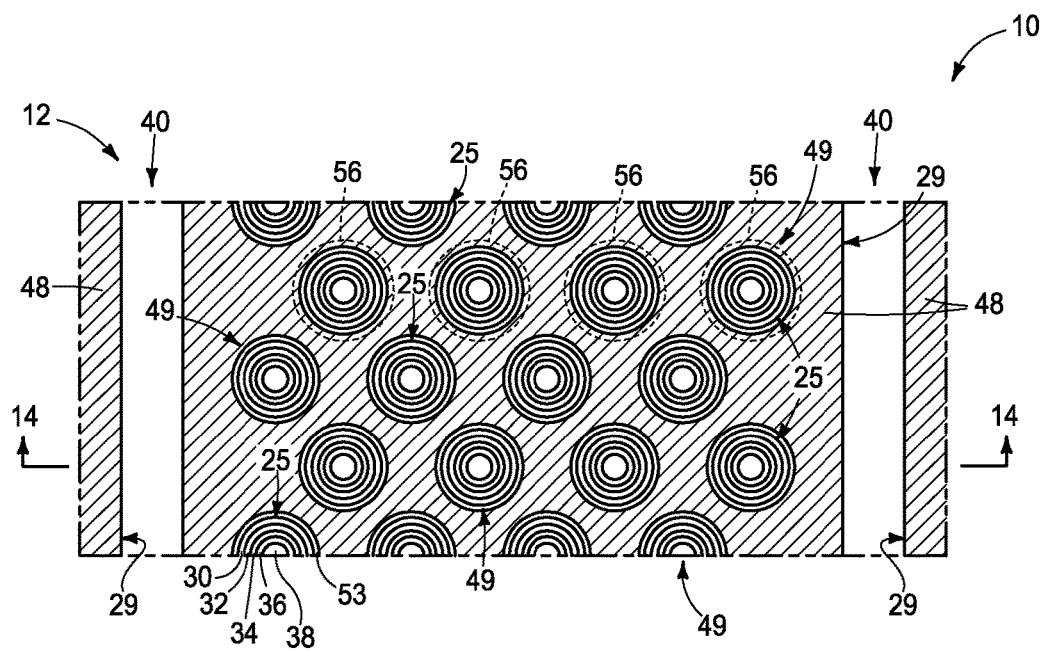
Figure 16:
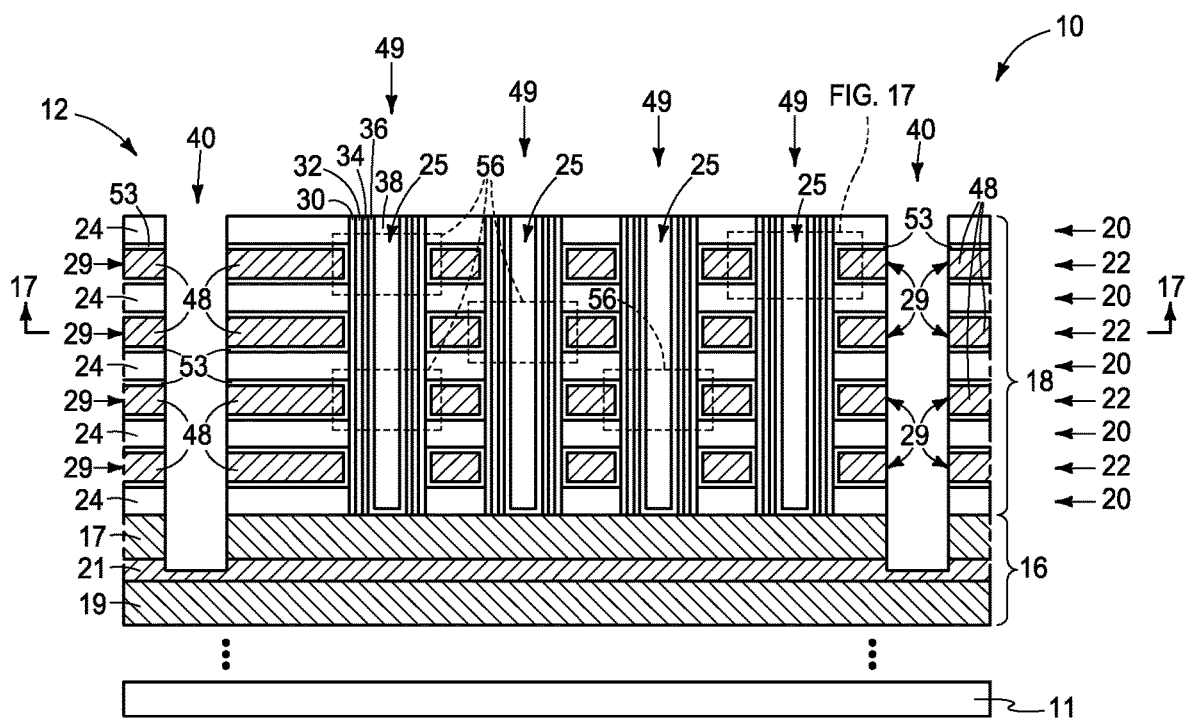
Figure 17:
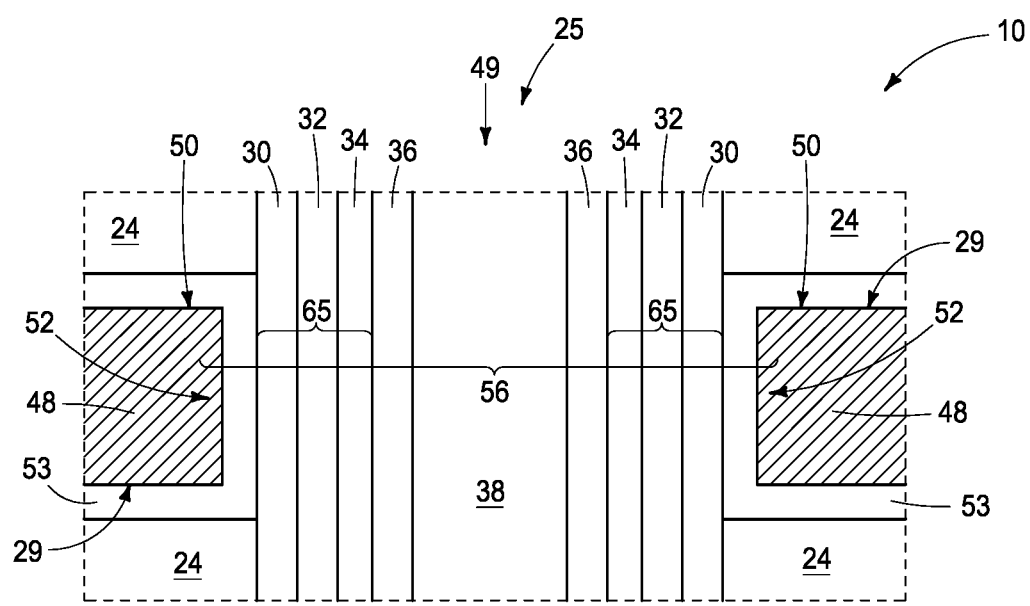

Referring to FIGS. 15-17, conducting material 48 and insulating material 53 have been removed from individual trenches 40. Such has resulted in formation of conductive lines 29 (e.g., wordlines) and elevationally-extending strings 49 of individual transistors and/or memory cells 56. Such removing may be conducted by etching, for example by one or both of anisotropic etching or isotropic etching. In one isotropic etching example, trenches 40 can be formed to be wider than the vertical depth of individual conductive tiers 22. Conducting material 48 can then be deposited to a thickness that less-than-fills trenches 40 (not shown), for example to leave a laterally-centered void space within trenches 40 (not shown). Thereafter, such conducting material can be isotropically etched within the void space to form conductive lines 29 that are separated as is shown by the depicted FIGS. 14 and 15 cross-sections. Approximate locations of transistors and/or memory cells 56 are indicated with a bracket in FIG. 17 and some with dashed outlines in FIGS. 15 and 16, with transistors and/or memory cells 56 being essentially ring-like or annular in the depicted example. Conducting material 48 may be considered as having terminal ends 50 (FIG. 17) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 18:
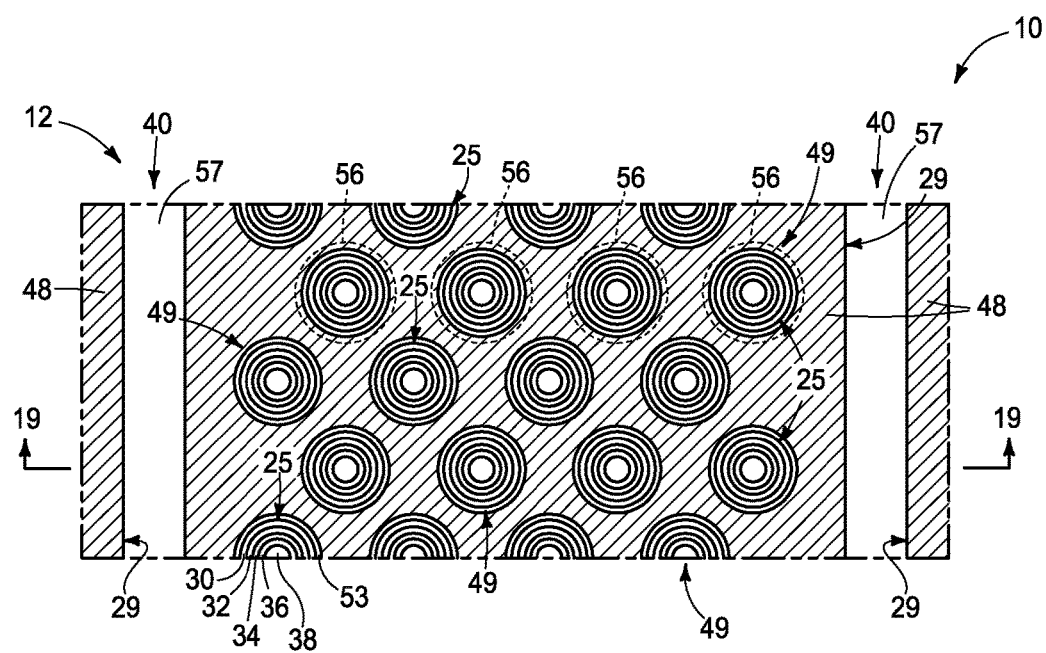
Figure 19:
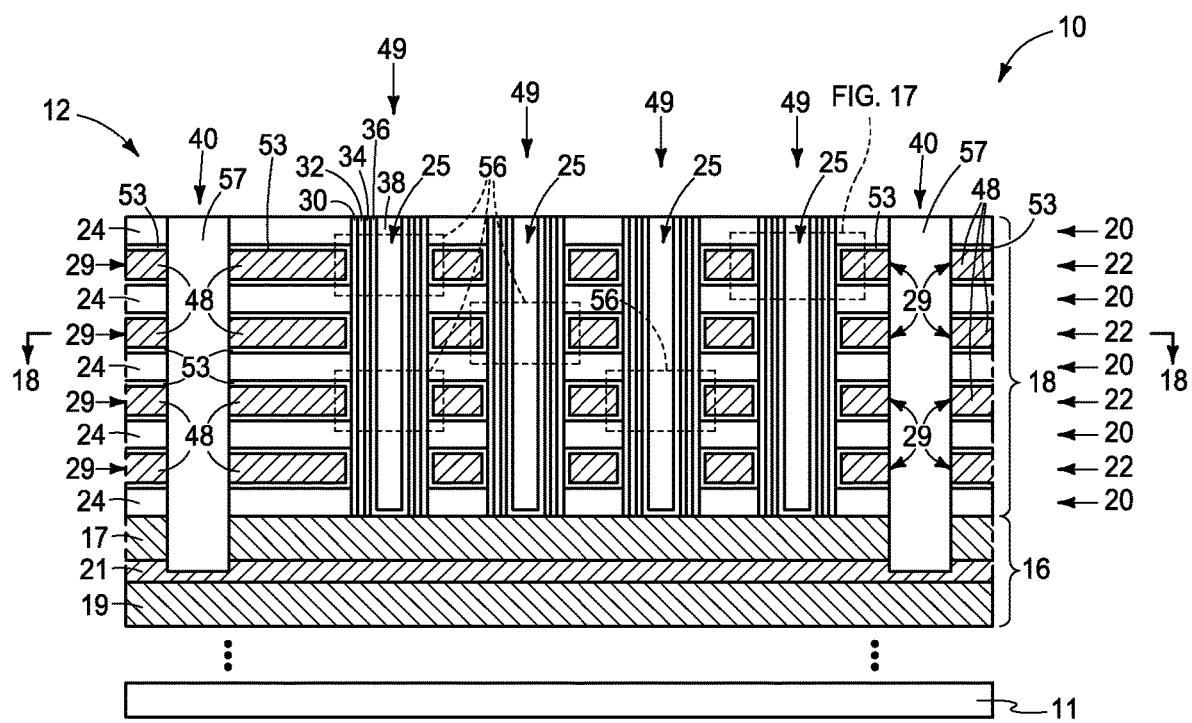

Referring to FIGS. 18 and 19, a material 57 (dielectric and/or silicon-containing such as undoped polysilicon) has been formed in individual trenches 40.

Any other attribute(s) or aspect(s) as shown and/or described herein with respect to other embodiments may be used with respect to the above-described embodiments.

In one embodiment, a method used in forming a memory array (e.g., 12) comprises forming a substrate (e.g., 10) comprising a conductor tier (e.g., 16) comprising upper conductor material (e.g., 17), lower metal material (e.g., 19), and intervening metal material (e.g., 21) vertically between the upper conductor material and the lower metal material. The intervening metal material, the upper conductor material, and the lower metal material are of different compositions relative one another, with the intervening metal material having a reduction potential that is less than 0.7V away from the reduction potential of the upper conductor material. A stack (e.g., 18) comprising vertically-alternating insulative tiers (e.g., 20) and conductive tiers (e.g., 22) is formed above the conductor tier. Channel material (e.g., 36) is formed through the insulative tiers and the conductive tiers. Horizontally-elongated trenches (e.g., 40) are formed through the stack to the conductor tier. Elevationally-extending strings (e.g., 49) of memory cells (e.g., 56) are formed in the stack. Individual of the memory cells comprise the channel material, a gate region (e.g., 52) that is part of a conductive line (e.g., 29) in individual of the conductive tiers, and a memory structure (e.g., 65) laterally between the gate region and the channel material in the individual conductive tiers. In one embodiment, the channel material is formed before forming the trenches. In one embodiment, conducting material of the conductive lines is deposited after forming the trenches. In one embodiment, conducting material of the conductive lines is deposited before forming the trenches (e.g., gate-first processing). Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a conductor tier (e.g., 16) comprising upper conductor material (e.g., 17), lower metal material (e.g., 19), and intervening metal material (e.g., 21) vertically between the upper conductor material and the lower metal material. The intervening metal material, the upper conductor material, and the lower metal material are of different compositions relative one another, with the intervening metal material having a reduction potential that is less than 0.7V away from the reduction potential of the upper conductor material. A stack (e.g., 18) comprising vertically-alternating insulative tiers (e.g., 20) and conductive tiers (e.g., 22) is above the conductor tier. Strings (e.g., 49) of memory cells (e.g., 56) in the stack comprise channel material (e.g., 36) extending through the insulative tiers and the conductive tiers. Individual of the memory cells comprise the channel material, a gate region (e.g., 52) that is part of a conductive line (e.g., 29) in individual of the conductive tiers, and a memory structure (e.g., 65) laterally between the gate region and the channel material in the individual conductive tiers. Any other attribute(s) or aspect(s) as shown and/or described herein with respect to other embodiments may be used.

In one embodiment, a memory array (e.g., 12) comprises a conductor tier (e.g., 16) comprising upper conductor material (e.g., 17), lower metal material (e.g., 19), and intervening metal material (e.g., 21) vertically between the upper conductor material and the lower metal material. The upper conductor material comprises conductively-doped polysilicon, the lower metal material comprises $WSi_x$, and the intervening metal material comprises at least one of TiN and WN. A stack (e.g., 18) comprising vertically-alternating insulative tiers (e.g., 20) and conductive tiers (e.g., 22) is above the conductor tier. Strings (e.g., 49) of memory cells (e.g., 56) in the stack comprise channel material (e.g., 36) extending through the insulative tiers and the conductive tiers. Individual of the memory cells comprise the channel material, a gate region (e.g., 52) that is part of a conductive line (e.g., 29) in individual of the conductive tiers, and a memory structure (e.g., 65) laterally between the gate region and the channel material in the individual conductive tiers. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 100 of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a substrate comprising a conductor tier comprising upper conductor material, lower metal material, and intervening metal material vertically between the upper conductor material and the lower metal material. The intervening metal material, the upper conductor material, and the lower metal material are of different compositions relative one another. The intervening metal material has a reduction potential that is less than 0.7V away from the reduction potential of the upper conductor material. A stack comprising vertically-alternating insulative tiers and conductive tiers is formed above the conductor tier. Horizontally-elongated trenches are formed through the stack to the conductor tier. Elevationally-extending strings of memory cells are formed in the stack. Individual of the memory cells comprise channel material extending through the insulative tiers and the conductive tiers, a gate region that is part of a conductive line in individual of the conductive tiers, and a memory structure laterally between the gate region and the channel material in the individual conductive tiers.

In some embodiments, a method used in forming a memory array comprises forming a substrate comprising a conductor tier comprising upper conductor material, lower metal material, and intervening metal material vertically between the upper conductor material and the lower metal material. The upper conductor material comprises conductively-doped polysilicon, the lower metal material comprises $WSi_x$, and the intervening metal material comprises at least one of TiN and WN. A stack comprising vertically-alternating insulative tiers and conductive tiers is formed above the conductor tier. Horizontally-elongated trenches are formed through the stack to the conductor tier. Elevationally-extending strings of memory cells are formed in the stack. Individual of the memory cells comprise channel material extending through the insulative tiers and the conductive tiers, a gate region that is part of a conductive line in individual of the conductive tiers, and a memory structure laterally between the gate region and the channel material in the individual conductive tiers.

In some embodiments, a method used in forming a memory array comprises forming a substrate comprising a conductor tier comprising upper conductor material, lower metal material, and intervening metal material vertically between the upper conductor material and the lower metal material. The intervening metal material, the upper conductor material, and the lower metal material are of different compositions relative one another. The intervening metal material has a reduction potential that is less than 0.7V away from the reduction potential of the upper conductor material. A stack comprising vertically-alternating insulative tiers and conductive tiers is formed above the conductor tier. The insulative tiers comprise insulative first material and the conductive tiers comprise second material that is of different composition from that of the first material. Horizontally-elongated trenches are formed through the stack to the conductor tier. The second material is from the conductive tiers is replaced with conducting material that is used to form individual conductive lines in the conductive tiers. Elevationally-extending strings of memory cells are formed in the stack. Individual of the memory cells comprise channel material extending through the insulative tiers and the conductive tiers and directly electrically coupled to the conductor tier, a gate region that is part of one of the individual conductive lines, and a memory structure laterally between the gate region and the channel material in the individual conductive tiers.

In some embodiments, a memory array comprises a conductor tier comprising upper conductor material, lower metal material, and intervening metal material vertically between the upper conductor material and the lower metal material. The intervening metal material, the upper conductor material, and the lower metal material are of different compositions relative one another. The intervening metal material has a reduction potential that is less than 0.7V away from the reduction potential of the upper conductor material. A stack comprising vertically-alternating insulative tiers and conductive tiers is above the conductor tier. Strings of memory cells are in the stack and comprise channel material extending through the insulative tiers and the conductive tiers. Individual of the memory cells comprise the channel material, a gate region that is part of a conductive line in individual of the conductive tiers, and a memory structure laterally between the gate region and the channel material in the individual conductive tiers.

In one embodiment, a memory array comprises a conductor tier comprising upper conductor material, lower metal material, and intervening metal material vertically between the upper conductor material and the lower metal material. The upper conductor material comprises conductively-doped polysilicon, the lower metal material comprises $WSi_x$, and the intervening metal material comprises at least one of TiN and WN. A stack comprises vertically-alternating insulative tiers and conductive tiers is above the conductor tier. Strings of memory cells are in the stack and comprise channel material extending through the insulative tiers and the conductive tier. Individual of the memory cells comprise the channel material, a gate region that is part of a conductive line in individual of the conductive tiers, and a memory structure laterally between the gate region and the channel material in the individual conductive tiers In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
    forming a substrate comprising a conductor tier comprising upper conductor material, lower metal material, and intervening metal material vertically between the upper conductor material and the lower metal material; the intervening metal material, the upper conductor material, and the lower metal material being of different compositions relative one another; the intervening metal material having a reduction potential that is less than 0.7V away from the reduction potential of the upper conductor material;
    forming a stack comprising vertically-alternating insulative tiers and conductive tiers above the conductor tier;
    forming horizontally-elongated trenches through the stack to the conductor tier; and
    forming elevationally-extending strings of memory cells in the stack; individual of the memory cells comprising channel material extending through the insulative tiers and the conductive tiers, a gate region that is part of a conductive line in individual of the conductive tiers, and a memory structure laterally between the gate region and the channel material in the individual conductive tiers.

2. The method of claim 1 wherein the intervening metal material has a reduction potential that is less than 0.5V away from the reduction potential of the upper conductor material.

3. The method of claim 2 wherein the intervening metal material has a reduction potential that is less than 0.3V away from the reduction potential of the upper conductor material.

4. The method of claim 3 wherein the intervening metal material has a reduction potential that is less than 0.1V away from the reduction potential of the upper conductor material.

5. The method of claim 1 wherein the intervening metal material has a higher reduction potential than that of the upper conductor material.

6. The method of claim 1 wherein the upper conductor material comprises conductively-doped semiconductive material.

7. The method of claim 6 wherein the upper conductor material comprises conductively-doped polysilicon.

8. The method of claim 1 wherein the lower metal material comprises at least one of TiN, WN, Co, Mo, $CoSi_x$, $MoSi_x$, Ta, and Ru.

9. The method of claim 1 wherein the intervening metal material comprises at least one of TiN, $TiSi_x$, $TiSi_xN_y$, $WSi_xN_y$, WN, WB, $WB_xN_y$, Ta, TaN, $TaSi_x$, $CoSi_x$, CoN, MoN, $MoSi_x$, and AlN.

10. The method of claim 9 wherein the intervening metal material comprises at least two of TiN, $TiSi_x$, $TiSi_xN_y$, $WSi_xN_y$, WN, WB, $WB_xN_y$, Ta, TaN, $TaSi_x$, $CoSi_x$, CoN, MoN, $MoSi_x$, and AlN.

11. The method of claim 1 wherein,
    the lower metal material comprises at least one of TiN, WN, Co, Mo, $CoSi_x$, $MoSi_x$, Ta, and Ru; and
    the intervening metal material comprises at least one of TiN, $TiSi_x$, $TiSi_xN_y$, $WSi_xN_y$, WN, WB, $WB_xN_y$, Ta, TaN, $TaSi_x$, $CoSi_x$, CoN, MoN, $MoSi_x$, and AlN.

12. The method of claim 1 wherein the trenches are formed by etching that stops on the upper conductor material.

13. The method of claim 1 wherein the trenches are formed by etching that stops on the intervening material.

14. The method of claim 13 wherein forming the trenches etches partially into the intervening material.

15. The method of claim 1 comprising forming the channel material before forming the trenches.

16. The method of claim 1 wherein conducting material of the conductive lines is deposited after forming the trenches.

17. The method of claim 1 wherein conducting material of the conductive lines is deposited before forming the trenches.

18. A method used in forming a memory array, comprising:
forming a substrate comprising a conductor tier comprising upper conductor material, lower metal material, and intervening metal material vertically between the upper conductor material and the lower metal material, the upper conductor material comprising conductively-doped polysilicon, the lower metal material comprising $WSi_x$, and the intervening metal material comprising at least one of TiN and WN;
forming a stack comprising vertically-alternating insulative tiers and conductive tiers above the conductor tier;
forming horizontally-elongated trenches through the stack to the conductor tier; and
forming elevationally-extending strings of memory cells in the stack; individual of the memory cells comprising channel material extending through the insulative tiers and the conductive tiers, a gate region that is part of a conductive line in individual of the conductive tiers, and a memory structure laterally between the gate region and the channel material in the individual conductive tiers.

19. The method of claim 18 wherein the intervening metal material comprises TiN.

20. The method of claim 19 wherein the intervening metal material consists essentially of TiN.

21. The method of claim 18 wherein the intervening metal material comprises WN.

22. The method of claim 21 wherein the intervening metal material consists essentially of WN.

23. The method of claim 18 wherein the intervening metal material comprises TiN and WN.

24. A method used in forming a memory array, comprising:
forming a substrate comprising a conductor tier comprising upper conductor material, lower metal material, and intervening metal material vertically between the upper conductor material and the lower metal material; the intervening metal material, the upper conductor material, and the lower metal material being of different compositions relative one another; the intervening metal material having a reduction potential that is less than 0.7V away from the reduction potential of the upper conductor material;
forming a stack comprising vertically-alternating insulative tiers and conductive tiers above the conductor tier, the insulative tiers comprising insulative first material, the conductive tiers comprising second material that is of different composition from that of the first material;
forming channel material through the insulative tiers and the conductive tiers and directly electrically coupled to the conductor tier;
forming horizontally-elongated trenches through the stack to the conductor tier;
replacing the second material from the conductive tiers with conducting material that is used to form individual conductive lines in the conductive tiers; and
forming elevationally-extending strings of memory cells in the stack; individual of the memory cells comprising channel material extending through the insulative tiers and the conductive tiers and directly electrically coupled to the conductor tier, a gate region that is part of one of the individual conductive lines, and a memory structure laterally between the gate region and the channel material in the individual conductive tiers.

25. The method of claim 21 comprising forming the strings to be vertical or within 10° of vertical.

26. The method of claim 21 wherein the memory array comprises NAND.

27. The method of claim 21 comprising forming CMOS under array circuitry electrically coupled to at least one of (a) the conductor tier and (b) the conductive lines.

28. The method of claim 21 comprising forming the memory structure to comprise:
a charge-blocking region elevationally along the gate region;
storage material elevationally along individual of the charge-blocking regions; and
insulative charge-passage material laterally between the channel material and the storage material.

\* \* \* \* \*